United States Patent [19]

Cowher et al.

[11] 4,443,489
[45] Apr. 17, 1984

[54] METHOD FOR THE FORMATION OF PHOSPHOROUS-NITROGEN BASED GLASSES USEFUL FOR THE PASSIVATION OF III-V SEMICONDUCTOR MATERIALS

[75] Inventors: Melvyn E. Cowher, East Brookfield, Mass.; Alexander J. Shuskus, West Hartford, Conn.

[73] Assignee: United Technologies Corporation, Hartford, Conn.

[21] Appl. No.: 493,181

[22] Filed: May 10, 1983

[51] Int. Cl.³ .............................................. B05D 5/12
[52] U.S. Cl. ...................................... 427/38; 427/82; 204/177; 357/52
[58] Field of Search ............................ 427/38, 39, 82; 204/177; 357/52

[56] References Cited

U.S. PATENT DOCUMENTS

| 2,952,599 | 9/1960 | Suchet | 204/177 |
| 3,424,661 | 1/1969 | Androshuk et al. | 204/164 |
| 3,549,411 | 12/1970 | Bean et al. | 427/39 |
| 4,172,906 | 10/1979 | Pancholy | 427/82 |
| 4,223,048 | 9/1980 | Engle, Jr. | 427/39 |
| 4,226,898 | 10/1980 | Ovshinsky et al. | 427/39 |
| 4,279,723 | 7/1981 | Osada et al. | 204/164 |
| 4,289,539 | 9/1981 | Li | 106/286.8 |

OTHER PUBLICATIONS

Miller and Shaw, *Phosphorus–Nitrogen Compounds* Part III–Phosphams, Jrnl. of Chem. Soc., Jun., 1963, p. 3233.
Vebrek and Roos, *Dielectric Properties of Phosphorus Nitride Films,* Jrnl of Chem. Solids, 1976, vol. 37, p. 554.
Vebrek, Iqbal, Brunner and Scharli, *Preparation and Properties of Amorphous Nitride Prepared in a Low-Pressure Plasma,* Philosophical Magazine B, 1981, vol. 43, No. 3, 527–547.

*Primary Examiner*—John H. Newsome
*Attorney, Agent, or Firm*—Alan C. Cohen

[57] ABSTRACT

A method for the chemical vapor deposition of amorphous, glass-like, phosphorous-nitrogen based films on the surface of a substrate is disclosed. The process entails exposing the substrate to a reactant gas stream comprising phosphorous, nitrogen and hydrogen. This method is particularly suited for passivating Group III-V semiconductor materials.

5 Claims, 4 Drawing Figures

METHOD FOR THE FORMATION OF PHOSPHOROUS-NITROGEN BASED GLASSES USEFUL FOR THE PASSIVATION OF III-V SEMICONDUCTOR MATERIALS

DESCRIPTION

TECHNICAL FIELD

The field of art to which this invention pertains is plasma enhanced chemical vapor deposition of phosphorus-nitrogen based glasses.

BACKGROUND ART

III-V type semiconductors are compounds such as GaAs, InSb, InP, InAS and $In_xGa_{x-1}As$, where In and Ga are in Group III in the periodic Table and As, Sb and P are in Group V. These materials have been under investigation by the semiconductor industry for many years. The physical properties of some of these materials, particularly gallium arsenide, show them to be superior to silicon for certain applications. Properties such as larger band-gap energy, along with higher electron mobility and larger electron saturation drift velocities means faster device operations. One particularly attractive application for these III-V materials is in insulated gate field effect transistors operating in the inversion mode (IGFET).

An insulating gate field effect transistor operating in the inversion mode operates on the principle that when a bias voltage is applied to the insulated gate (a dielectric material), the potential alters the surface potential of the semiconductor material, creating an inversion layer.

The inversion layer is created by the effect the potential on the gate (shown at 14 in FIG. 4) has on the position of the valence and conduction bands located at the surface of the semiconductor relative to the position of the energy bands in the bulk. Essentially, this potential bends these bands near the interface surface of the semiconductor and the insulated gate, toward or away from the fermi level depending on the charge on the gate and whether the semiconductor material is p- or n-type. In p-type gallium arsenide, when a positive bias is applied to the gate, the conduction band is shifted toward the fermi level resulting in the generation of electrons populating the conduction band. Under this condition, the near surface of the p-type semiconductor is inverted to n-type. This inversion results in an excess of electrons in a layer between the source (shown as 12 in FIG. 4) and the drain (shown as 16 in FIG. 4). These electrons, the quantity of which is dependent on the gate potential, are available for conduction. As a result, a controllable electro-conduction path exists between the source and the drain, which permits the transistor to function.

One basic problem in utilizing III-V semiconductor material in IGFETs, is the difficulty in finding a passivating material which does not result in a high surface state density, thereby pinning the fermi level near midgap and creating a condition which prevents inversion from taking place. It was determined some time ago that the presence of oxygen at the interface results in the generation of a high density of extrinsic surface states. Therefore, an assessment of the suitability of an alternate dielectric for the passivation of III-V semiconductor surfaces is dependent on a material which is substantially oxygen free and which will permit the deposition of the dielectric without the formation of an intervening interfacial oxide layer. Additionally, such material must have good electrical and thermal stability, be chemically inert, and must be capable of being applied at temperatures which will not decompose the semiconductor surface.

The availability of an effective, stable passivating material, in particular one which will allow the production of insulated gate field effect transistors operating in the inversion mode, would have a significant impact on the III-V semiconductor device industry. In particular, it would open the way for the fabrication of these IGFETS which are necessary components for implementing III-V semiconductor large scale integration (LSI) high speed digital circuits. Accordingly, what is needed in the art is a method for forming phosphorous-nitrogen based films at low enough temperatures to allow their use as coatings with III-V semiconductors.

DISCLOSURE OF INVENTION

This invention describes a method of forming substantially oxygen-free phosphorus-nitrogen films, particularly phospham, on III-V semiconductor compounds and other materials using plasma enhanced chemical vapor deposition. The plasma enhancement permits the deposition of the films to take place at sufficiently low temperatures to avoid thermal decomposition of the III-V semiconductor surface. The method uses an RF induced plasma containing hydrogen, phosphorous and nitrogen to spontaneously deposit the film onto a substrate material heated to approximately 260° C. The particular composition of the deposited film (e.g. phospham, $P_3N_5$, etc.) is a function of the relationship of the pressure of the individual gases which constitute the plasma, the temperature of the substrate and the distance of the substrate from the center of the coil.

The foregoing and other features and advantages of the present invention will become more apparent from the following description and accompanying drawings.

BRIEF DESCRIPTION OF THE DRAWINGS

FIG. 2 is a plot of capacitance versus applied voltage for gallium arsenide, passivated with the present invention illustrating surface inversion.

BEST MODE FOR CARRYING OUT THE INVENTION

Figure 1:
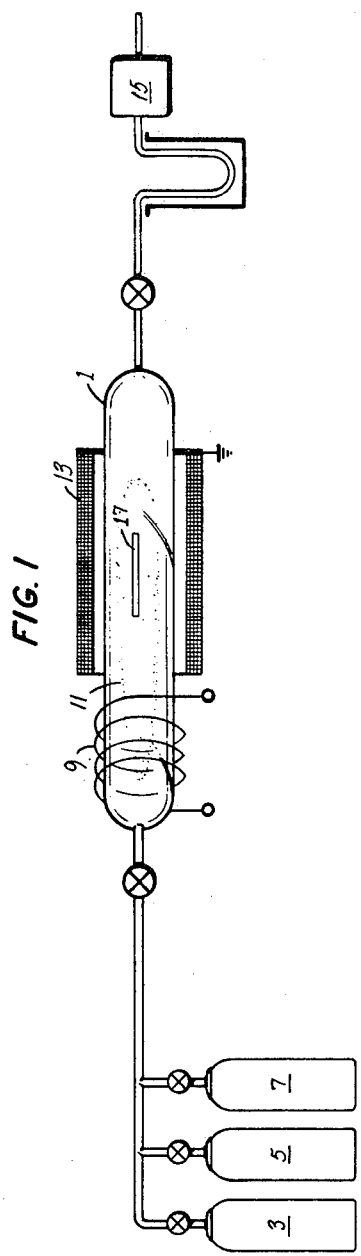
FIG. 1 is a schematic illustration of an apparatus which can be used to produce the surface passivating coating of the present invention.

The method for forming the substantially oxygen-free phosphorus-nitrogen compounds, particularly phospham $(PN_2N)_x$, which would allow the use of III-V semiconductors in insulated gate field effect transistors is plasma enhanced chemical vapor deposition (PECVD). A schematic of a typical apparatus which may be used to perform this method is shown in FIG. 1. This schematic is meant to be exemplary and illustrative rather than limiting.

The basic concept employed in the process is that of generating a plasma of hydrogen, nitrogen and phosphorous in a substantially oxygen-free environment, utilizing an RF induction coil, then contacting the plasma with the substrate and spontaneously depositing the film.

The basic apparatus required to perform this process will be known to those skilled in the art. It shold contain a plasma chamber 1, a source of plasma constituents 3, 5, 7 as well as an RF induction coil 9 to form the plasma 11, a grounded metal screen or shield 13 to aid in the film deposition and a source of vacuum 15. Typically, the reactants used to form the plasma are gases, in this case phosphine, nitrogen, and hydrogen. The partial pressure of each of these three constituents is important in forming the film of phospham on the substrate 17. The relationship of the pressures of these three gases should be about 0.075 torr phosphine, about 0.50 torr hydrogen and about 1.5 torr nitrogen. These figures represent the relationship of the gases to one another and not the absolute pressure within the chamber. The absolute pressure in the chamber during operation can range from about 0.5 to about 4.0 torr. The primary limitation on this pressure is that should the pressure be too low, the plasma becomes diffused and ineffective and if the pressure is too high, it then becomes too dense to be effective. Although this process has been practiced using the individual gases phosphine, nitrogen and hydrogen, it is possible to use gases which are premixed such as 5% phosphine in hydrogen or 5% phosphine in nitrogen. Additionally, it should be possible to use elemental phosphorous or phosphorous containing materials as a source for the phosphorous in the plasma, if they do not introduce any detrimental contaminants.

The RF induction coil need not be of any particular design, however, it must be capable of raising the substrate temperature to about 260° C. to about 270° C. It is thought that the substrate's temperature is a critical criteria is determining which compound will be deposited. In the case of phospham, the substrate temperature should be about 260° C. to about 270° C. The preferred embodiment is a six-turn RF coil (three inches from end to end) operating in the range of about 100 to about 500 watts. It should be noted that the position of the substrate to be coated within the plasma is critical, as different phosphorous-nitrogen compounds will be deposited at different positions within the plasma. The particular position in the plasma in which to achieve any given component may be determined by placing a quartz rod axially along the path of the plasma and determining by chemical analysis which compounds are formed in which portion of the plasma. When using the preferred RF coil, it has been determined that at 500 watts of power, the phospham will be deposited approximately eight inches from the center of the coil. Phospham is deposited three inches from the center of the coil when the power is set at 100 watts. The deposition rate of phospham under both of these conditions is about 200 Å/min. To aid in depositing a uniform, stochiometric film, a grounded metal shield is placed around the outside of the chamber adjacent to but not touching the RF coil.

EXAMPLE I

A phospham glass was deposited on a gallium arsenide substrate to form an insulated gate as follows:

A sample of gallium arsenide approximately 2 cm by 2 cm, was placed in the quartz reactor tube, eight inches from the center of the six-turn RF induction coil. The reactor tube was evacuated to less than $10^{-6}$ torr and purged with high purity dry hydrogen. The hydrogen gas was then set at a pressure of about 0.50 torr while the RF coil was energized to 500 watts, 13.5 MHz, creating a hydrogen plasma. The plasma was brought into contact with the substrate raising its temperature to about 270° C. and etching away surface oxides. Phosphine and nitrogen were then simultaneously introduced to the reactor tube at reduced pressures of 0.075 and 1.5 torr respectively, along with the hydrogen which was at 0.5 torr. Under these conditions a phospham film was deposited at the rate of approximately 200 Å/min.

EXAMPLE II

A second phospham film was deposited on gallium arsenide using the process in Example I except that the RF coil was energized to 100 watts and the substrate was placed three inches from the center of the coil.

The resulting $(PN_2H)_n$ was amorphous, glass-like, hard, smooth and was impervious to $H_2O$, organic solvents and hot concentrated acids and bases. Phospham has been deposited using this method on a wide variety of materials such as glasses, semiconductors, metals, and salts, with excellent adhesion. Although phospham cannot be dissolved by wet etching, it lends itself to fabrication schemes in that it is easily ion milled or readily etched in an $N_2$ or $H_2$ plasma at 300° C. The following properties have been determined from various analytical techniques:

| | |
|---|---|
| Dielectric Constant | 12-15 |
| Index of Refraction | 1.71 |
| Breakdown Voltage | $10^6$ v/cm |
| Band Edge | 200 nm |
| Resistivity | $\geq 10^{16}$ ohm-cm |

Following the deposition of the phospham films onto the substrate to a thickness of approximately 1000 Å, they are removed and formed into insulated gate field effect transistors using aluminum as the gate contacting material. These IGFETS were then annealed at 300° C. in a hydrogen atmosphere for one hour.

Initially, capacitance-voltage measurements were carried out to determine if the capacitance-voltage (C-V) characteristics were consistent with inversion.

FIG. 2 shows a typical C-V characteristic graph obtained and the occurrence of surface inversion.

Figure 3:
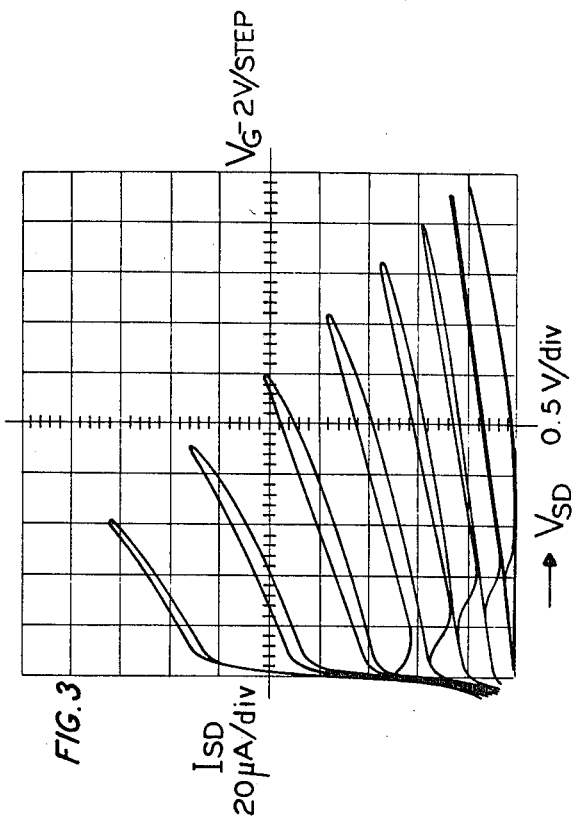
FIG. 3 is a plot showing the increase in current flow when the voltage to the gate is increased in a phospham passivated III-V semiconductor field effect transistor.
Figure 4:
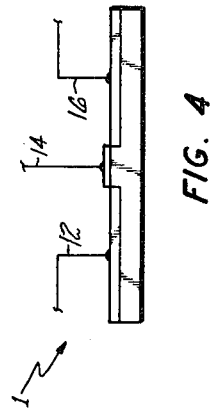
FIG. 4 is a schematic of an IGFET designed to operate in the inversion mode.

FIG. 3 shows the current voltage characteristics of a typical insulated gate field effect transistor with an insulated gate of phospham as a function of gate bias for a P-channel device and clearly shows that inversion is achieved.

The process disclosed in unique in that it is capable of forming thin films of substantially oxygen-free, amorphous, phosphorous-nitrogen insulating glass. It is particularly useful in depositing phospham $(PN_2H)_x$ which, until recently, was considered to exist as only a nonfusible white powder. Phospham and other P-N compounds, i.e. $P_3N_5$ should prove very useful as protective coatings and passivating materials in the semiconductor industry, and through the use of this process these new films are available.

Having thus described our invention, that which we claim as new and desire to secure by Letters Patent of the United States is:

1. A method for depositing a thin, amorphous, glass-like corrosion resistant film of phospham on a III-V semiconductor material including the following steps:

placing the III-V semiconductor material in a reaction chamber;

raising the temperature of the material to about 260° C. to about 270° C. by contacting the material with an RF induced hydrogen plasma; and then spontaneously depositing the phospham on the material by contacting the material with an RF induced plasma of phosphorous, nitrogen and hydrogen.

2. The method of claim 1 wherein the pressure within the reaction chamber is about 0.5 torr to about 4.0 torr.

3. The method of claim 1 wherein the phosphorous is introduced as phosphine.

4. The method of claim 2 wherein the gases are introduced as 0.5 torr hydrogen, 0.075 torr phosphine, and 1.5 torr nitrogen.

5. The method of claim 3 wherein the III-V semiconductor material is gallium arsenide.

* * * * *